United States Patent [19]

Keswick et al.

[11] Patent Number: 5,399,237
[45] Date of Patent: Mar. 21, 1995

[54] ETCHING TITANIUM NITRIDE USING CARBON-FLUORIDE AND CARBON-OXIDE GAS

[75] Inventors: Peter Keswick, Fremont; Jeffrey Marks, San Jose, both of Calif.

[73] Assignee: Applied Materials, Inc., Santa Clara, Calif.

[21] Appl. No.: 188,493

[22] Filed: Jan. 27, 1994

[51] Int. Cl.$^6$ .......................... B44C 1/22; C03C 15/00
[52] U.S. Cl. ..................................... 156/643; 156/644; 156/656; 156/657; 156/659.1; 252/79.1
[58] Field of Search ............... 156/643, 646, 644, 655, 156/656, 657, 659.1, 662, 345; 252/79.1; 204/192.32, 192.35

[56] References Cited

U.S. PATENT DOCUMENTS

| 4,863,559 | 9/1989 | Douglas ............................ 156/662 X |
| 5,176,790 | 1/1993 | Arleo et al. ........................ 156/643 |

FOREIGN PATENT DOCUMENTS

0520519A1 12/1992 European Pat. Off. .

OTHER PUBLICATIONS

U.S. patent application Ser. No. 08/138,060, entitled "Plasma Etch Apparatus with Heated Scavenging Surfaces," by Rice, et al., filed Oct. 15, 1993.

*Primary Examiner*—William Powell
*Attorney, Agent, or Firm*—Ashok K. Janah

[57] ABSTRACT

A process for etching titanium nitride on a substrate 20 is described. In the process, a substrate 20 having a titanium nitride layer 24c thereon, and an insulative oxide layer 26 on the titanium nitride layer 24c is placed in a process chamber 42. Either a single stage, or a multiple stage version, of the process is then effected to etch the insulative oxide and titanium nitride layers. In the single stage version, the insulative oxide layer 26 and titanium nitride layer 24c are etched in a single stage, by introducing an etchant gas comprising carbon-fluoride gas and carbon-oxide gas into the process chamber 42, and generating a plasma from the etchant gas. The multiple stage version, comprises a first stage in which the insulative oxide layer 26 is etched using a plasma generated from carbon-fluoride gas, and a second stage in which the titanium nitride layer 24c is etched using a plasma generated from an etchant gas comprising carbon-fluoride gas and carbon-oxide gas. Suitable carbon-fluoride gases comprise $CF_3$, $CF_4$, $CH_3F$, $CHF_3$, $C_2F_6$, $C_3F_8$, $C_4F_8$ or $C_4F_{10}$, and suitable carbon-oxide gases comprise $CO$ or $CO_2$.

32 Claims, 2 Drawing Sheets

ETCHING TITANIUM NITRIDE USING CARBON-FLUORIDE AND CARBON-OXIDE GAS

BACKGROUND

This invention relates to a method for etching titanium nitride on semiconductor substrates.

Conductive features are used to electrically connect devices formed on semiconductor substrates. The conductive features typically comprise (i) a bottom barrier layer, (ii) an electrically conductive metal-containing layer, such as an aluminum alloy, at the middle of the feature, and (iii) a top antireflective layer, such as titanium nitride. An insulative oxide layer, such as a silicon oxide layer, is deposited on top of, and between the features, to electrically isolate the features. Apertures are etched through the insulative oxide layer and the titanium nitride layer to form holes. The holes are filled with conductive metal to form vertical electrically conductive interconnects, commonly known as vias.

The apertures through the insulative oxide and titanium nitride layers are etched in a multistep process. First, the insulative oxide layer is etched using reactive ion etching processes with fluorine-containing etchant gases. After etching of the insulative oxide layer, a wet chemical etching process is used to etch the titanium nitride layer of the features, to expose the conductive metal-containing layer in the features. Etching of the titanium nitride layer is necessary for the conductive interconnect to electrically contact the conductive metal-containing layer.

There are several problems with the multistep etching process. First, the reactive ion etching processes used to etch the oxide layer often have an inadequate etching selectivity ratio. The etch selectivity ratio is defined as the ratio of the etch rate for the etched layers to the resist etch rate. When both the insulative oxide and titanium nitride layers are etched, the combined etch rate for the insulative oxide and titanium nitride layers must be greater than the resist etch rate, in order for the resist layer to effectively protect the underlying oxide and titanium nitride layers. Excessive etching of the resist layer is also undesirable because it can cause excessive deposition of polymeric resist etchant by-products on the substrate and on the walls of the etching apparatus. Excessive quantities of such deposits are difficult to remove. Consequently, the etching selectivity ratio of the reactive ion etching process is preferably at least about 3, and more preferably at least about 4.

Another problem with current techniques relate to the wet chemical etching process used to etch the titanium nitride layer. To effect the wet chemical etching process, the substrate must be removed from the reactive ion etching apparatus and transferred to a wet chemical etching station. The transfer operation limits process throughput efficiency. Furthermore, when the substrate is exposed to the atmosphere during transfer, the etched layers on the substrate can corrode forming contaminants on the substrate. Also, wet chemical etchant processes often leave contaminant chemical residues on the substrate. These contaminants are only discovered in the final processing stages when the fully processed wafers are worth between $850,000 to $100,000, and often the entire wafer must be scrapped.

Thus, there is a need for a reactive ion etching process capable of etching the titanium nitride layer on the substrate. Such a process can provide greater process efficiency and can increase integrated circuit chip yields, compared to existing wet chemical etching processes. It is also desirable for the etching process to have a high etching selectivity ratio, and be amenable to mass production of circuit chips in conventional etching apparatus. It would be even more desirable for the etching process to be capable of removing both the insulative oxide layer and the titanium nitride layer on the substrate.

SUMMARY

The present invention provides a reactive ion etching process for etching titanium nitride that satisfies these needs, thereby eliminating the need to use a wet etch process. In the process, a substrate having a titanium nitride layer thereon, and an insulative oxide layer on the titanium nitride layer is placed in a process chamber. Either a single stage process or a multiple stage process is then performed to etch the insulative oxide and titanium nitride layers. In both versions of the process, the substrate remains in the process chamber, thereby overcoming the limitations of transferring partially etched substrates from one apparatus to another.

in the single stage version of the process, the insulative oxide and titanium nitride layers on the substrate are etched in a single stage, by introducing an etchant gas comprising carbon-fluoride gas and carbon-oxide gas into the process zone, and generating a plasma from the etchant gas. The plasma etches both the insulative oxide and titanium nitride layers on the substrate.

The multiple stage version of the process comprises a first stage in which the insulative oxide layer is etched using a plasma generated from carbon-fluoride gas, and a second stage in which the titanium nitride layer is etched using a plasma generated from an etchant gas comprising carbon-fluoride gas and carbon-oxide gas.

Suitable carbon-fluoride gases include $CF_3$, $CF_4$, $CH_3F$, $CHF_3$, $C_2H_2F_2$, $C_2F_6$, $C_3F_8$, $C_4F_{10}$ or $C_4F_{10}$, and suitable carbon-oxide gases include $CO$ or $CO_2$. A preferred combination of gases for the single stage process, comprises $C_2F_6$ and $CO$, and a preferred combination of gases for the second stage of the multiple stage process comprises $CH_3F$ and $CO_2$. These gas combinations provide improved etching selectivity and improved etching rates.

BRIEF DESCRIPTION OF THE DRAWINGS

These and other features, aspects, and advantages of the present invention will become better understood with reference to the following description, appended claims, and accompanying drawings where:

DESCRIPTION

Figure 1:
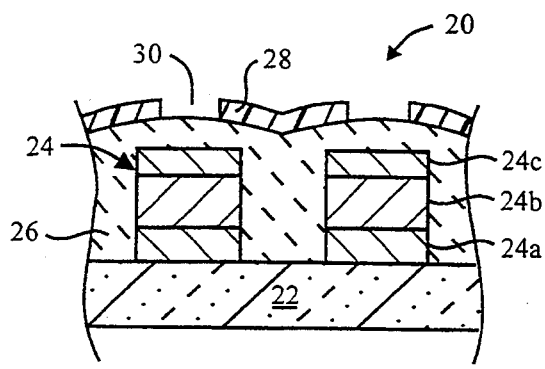
FIG. 1 is a vertical cross-sectional schematic view of a substrate, showing a titanium nitride layer, an insulative oxide layer and a resist layer on the substrate.
Figure 2:
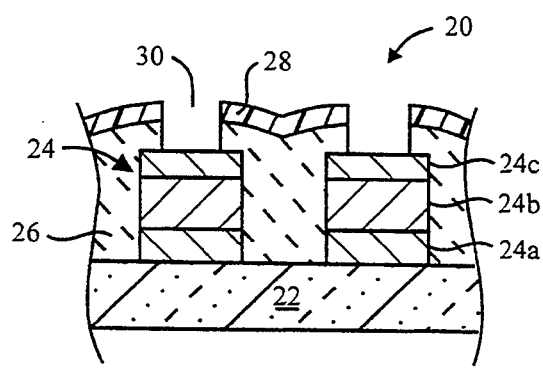
FIG. 2 is a vertical cross-sectional schematic view of the substrate of FIG. 1, after etching of the insulative oxide layer.
Figure 3:
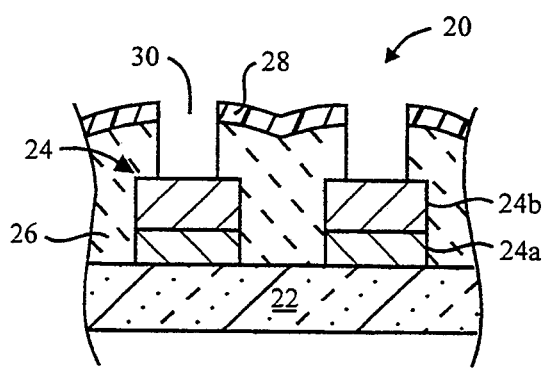
FIG. 3 is a vertical cross-sectional schematic view of the substrate of FIG. 2, after etching of the titanium nitride layer.

Referring now to FIG. 1, a process according to the present invention is performed on a substrate 20 comprising a wafer 22 with a horizontal layer of patterned conductive features 24 thereon, and an insulative oxide layer 26 over the features 24. The wafer 22 can be made of any material, such as semiconductor, glass, ceramic, metal, or polymer. Typically, the wafer 22 is a semiconductive wafer, such as a silicon or a gallium arsenide wafer. The features 24 on the wafer 22 typically comprise a plurality of layers, such as for example, (i) a base diffusion barrier layer 24a, comprising titanium, tungsten, titanium-tungsten, or titanium nitride; (ii) a middle electrically conductive layer 24b, such as an alloy of aluminum, silicon, and copper; and (iii) a top antireflective layer 24c, such as a layer of titanium nitride. The titanium nitride layer 24c is typically about 100 Å to about 1000 Å thick, and more typically about 250 Å thick. The layers 24a, 24b, and 24c are typically deposited by physical vapor deposition (PVD). A continuous insulative oxide layer 26, such as a silicon oxide layer, is deposited on and between the features 24. The insulative oxide layer 26 is typically about 0.5 $\mu$m to about 3 $\mu$m thick, and more typically about 1.5 $\mu$m thick. The oxide layer 26 is typically deposited by chemical vapor deposition (CVD).

A resist layer 28 which is resistant to etching, such as photoresist, is applied over the insulative oxide layer 26 and patterned to protect portions of the insulative oxide layer 26 during the etching process. Typically, the patterned resist layer 28 has holes 30 with diameters ranging from about 0.3 $\mu$m to about 1 $\mu$m. In the etching process described below, vias are etched at the bottom of the holes 30 in order to form conductive interconnects within the etched holes.

Figure 4:
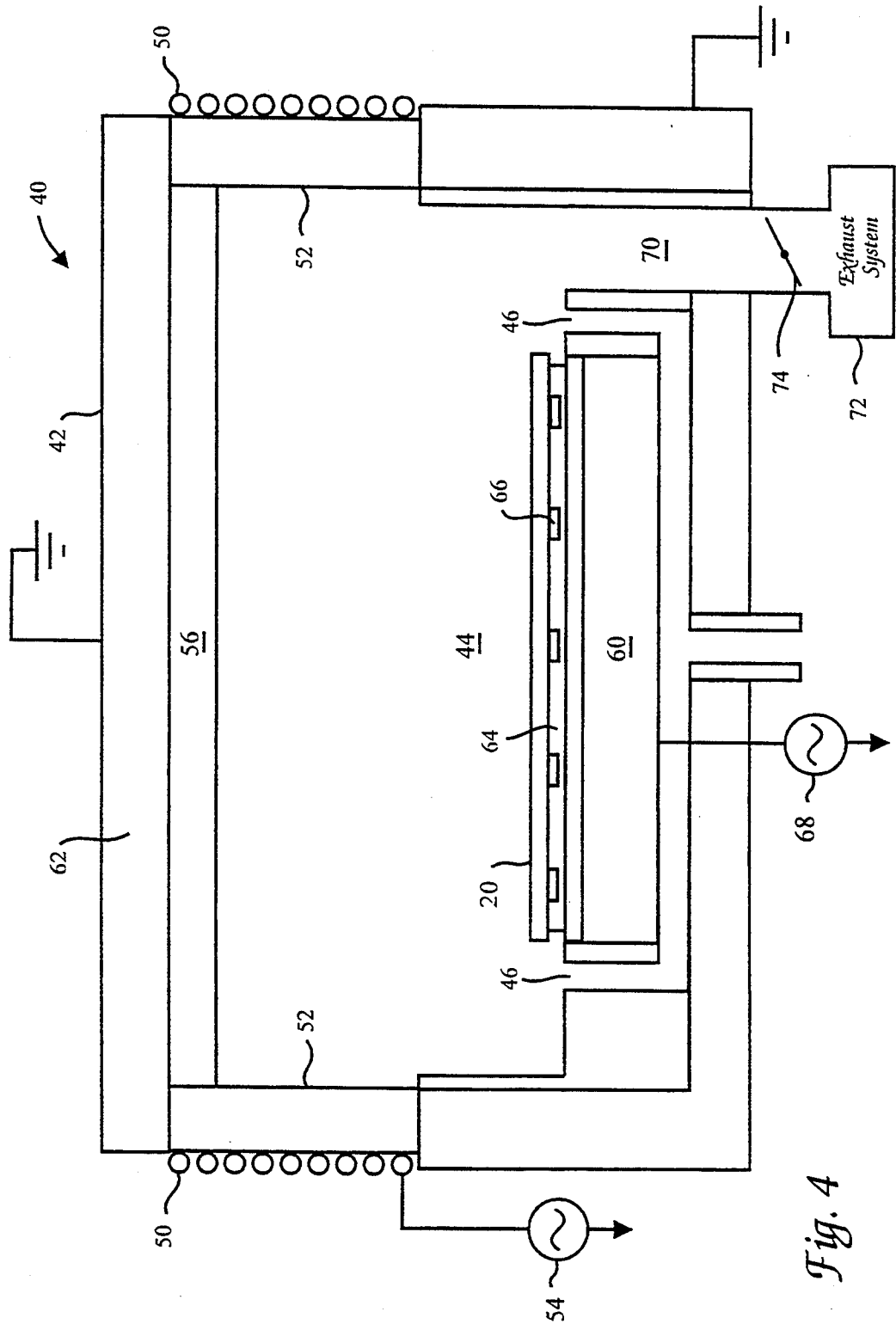
FIG. 4 is a vertical cross-sectional schematic view of an etching apparatus suitable for practicing the process of the present invention.

An etching apparatus 40 suitable for practicing the etching process of the present invention is schematically shown in FIG. 4, and described in more detail in U.S. Pat. application Ser. No. 08/138,060, filed on Oct. 15, 1993, by Rice, et al.; and in European Patent Document No. 0,520,519 A1, by Collins, et al., published on Dec. 30, 1992—both of which are incorporated herein by reference.

Generally, the etching apparatus 40 comprises a process chamber 42 having a process zone 44. Process gas is distributed in the process zone 44 using a gas manifold 46 peripheral to the wafer. Typically, the process gas is supplied to the manifold 46 using one or more sources of pressurized gas via a computer controlled flow controller (not shown).

A cylindrical antenna coil 50 is wrapped around sidewall 52 of the process chamber 42. The coil 50 is connected to an RF current source 54. When an RF current is applied through the coil 50, the coil 50 inductively couples energy into the chamber 42 for generating a plasma from the process gas in the process zone 44. The sidewall 52 of the chamber 42 is made of a dielectric material, such as quartz or ceramic, to preclude conductive coupling between the sidewalls 52 and the coil 50. A conventional heating element (not shown) near the sidewall 52 is provided for heating the sidewall 52 to a temperature sufficiently high to prevent the deposition of condensable etchant byproducts on the sidewall 52.

A slab of crystalline silicon material 56 is provided at the top of the process zone 44. When the silicon slab 56 is heated using a conventional heating element (not shown), the reactive silicon atoms at the surface of the slab react with gaseous species in the process zone 44. For example, when a carbon-fluoride gas is introduced into the chamber 42 and a plasma generated therefrom, the silicon atoms scavenge or combine with the fluorine species of the plasma to form gases such as $SiF_4$. The scavenging process reduces the amount of fluorine in the process zone 44, thereby increasing the carbon to fluorine ratio in the plasma. Higher carbon ratios are desirable to form carbon-rich polymers which deposit upon, and passivate, the freshly etched portions of the substrate 20. A detailed description of the scavenging process is disclosed in the aforementioned U.S. Patent Application by Rice, et al.

The substrate 20 is placed on a cathode 60 in the chamber 42, and an electrically grounded anode 62 forms the top of the chamber 42. The substrate can be held in place during the etching process using a mechanical chuck 64 with grooves 66 in which a coolant gas, such as helium, is held to control the temperature of the substrate 20. Alternatively, an electrostatic chuck, such as the chuck described in U.S. Pat. application Ser. No. 08/137,279, filed on Oct. 14, 1993, by Collins, et al., can also be used. When the cathode 60 is electrically biased with respect to the anode 62 using an RF source 68, the plasma in the chamber 42 impinges upon and the resultant plasma-activated reaction etches the substrate 20. Optionally, a magnetic field (not shown) can be used to enhance the density or uniformity of the plasma.

Spent process gas and etchant byproducts are exhausted from the process chamber 42 through an exhaust 70 which is connected to an exhaust system 72 capable of achieving a pressure of about $10^{-3}$ mTorr in the process chamber 42. A throttle valve 74 is provided in the exhaust 70 for controlling the pressure in the chamber 42.

To effect the process, the chamber 42 is evacuated to less than about 1 mTorr, and a substrate 20 is transferred to the chamber 42 from a load lock transfer chamber (not shown) maintained at vacuum. Etchant process gas is introduced into the chamber, and the chamber 42 is maintained at a pressure ranging from about 10 to about 50 mTorr and more typically about 20 mTorr. The etchant gas is introduced into the chamber 42 through the gas manifold 46. The etchant gas comprises a carbonfluoride and a carbon-oxide gas. By carbon-fluoride gas, there is meant a gaseous species containing carbon, fluorine, and optionally hydrogen, such as for example, $CF_3$, $CF_4$, $CH_3F$, $CHF_3$, $C_2F_6$, $C_3F_8$, $C_4F_8$ and $C_4F_{10}$. Preferably, the carbon-fluoride gas contains no element except C, F, and H. By carbon-oxide gas, there is meant a gaseous species containing carbon and oxygen, such as for example, CO and $CO_2$. Preferably, the carbon-oxide gas contains only C and O.

The process of the present invention can be effected in a single stage or in multiple stages. In the single stage version of the process, both the insulative oxide layer 26 and the titanium nitride layer 24c are etched in a single step. Because both layers are etched in a single step, the carbon-fluoride fluoride and carbon-oxide gas composition is selected so that all the insulative oxide layer and all the titanium nitride layer is etched before all the resist layer is etched. Thus, the gas composition is selected to provide an etching selectivity ratio, defined as the ratio of the combined etch rate of the insulative oxide and titanium nitride layers to the etch rate of the resist, of at least about 3, and more preferably at least about 4. The single stage process is preferred for process efficacy because it involves a single step.

The multiple stage version of the process includes a first stage in which the insulative oxide layer 26 is etched, and a second stage in which the titanium nitride layer 24c is etched. In addition, one or more intermediate stages can be used to ash the remnant resist on the substrate using conventional ashing methods. In the first stage of the process, the insulative oxide layer is etched using conventional oxide etching processes that use carbon-fluoride gases. In the second stage, the titanium nitride layer is etched using a carbon-fluoride and carbon-oxide gas. Preferably, the carbon-fluoride and carbon-oxide gas composition is selected to provide a high titanium nitride etch rate, of at least about 1 micron/minute, so that the entire titanium nitride layer can be etched before the oxide layer is etched.

The single stage and multiple stage versions of the process are described in detail below.

Single Stage Process

A suitable combination of gases for effecting the single stage version of the process comprises $C_2F_6$ and CO, in a volumetric flow ratio of from about 1:5 to about 1:40, more preferably of from about 1:1 to about 1:3, and most preferably of about 1:2. This combination of gases provides an etching selectivity ratio of at least about 3, and more typically at least about 4. For a twenty-two liter process chamber, suitable $C_2F_6$ flow rates are typically from about 20 to about 40 sccm, and more typically about 25 sccm; and suitable CO flow rates are typically from about 1 to about 100 sccm, and more typically about 50 sccm.

During the etching process, the chamber 42 is typically maintained at a pressure ranging from about 1 to about 10 mTorr, and more typically about 4 mTorr. A plasma is generated from the etchant gas by applying an RF current having a frequency of about 2 MHz to the inductive coil 50. Typically, the power level of the RF current applied to the coil is from about 1000 to about 3000 Watts, and more typically is about 2500 Watts. An RF bias current is also applied to the cathode 60 at a power level sufficient to cause the plasma generated by the inductive coil 50 to impinge upon and etch the substrate 20. A suitable cathode RF current power level is from about 1000 to about 2000 Watts, and more typically about 1500 Watts.

Multiple Stage Process

The multiple stage version of the process comprises a first stage in which the insulative oxide layer 26 on the substrate 20 is etched, and a second stage in which the titanium nitride layer 24c is etched. In addition, the process can comprises an intermediate stage between the first and second stages, in which remnant resist on the substrate 20 is ashed using conventional ashing methods. Each of these stages is described below.

First Stage

In the first stage, the insulative oxide layer 26 is etched using conventional etching processes. A suitable etching process comprises introducing a carbon-fluoride gas, such as $C_2F_6$, into the process chamber 42 at a rate of from about 20 to about 40 sccm, and more typically about 25 sccm. The chamber 42 is maintained at a pressure of about 4 mTorr. A plasma is generated from the $C_2F_6$ by applying an RF current having a power level of about 2500 Watts to the inductive coil 50. An RF bias current having a power level of about 1500 Watts is applied to the cathode 60 for causing the plasma to etch the insulative oxide layer 26 on the substrate 20.

Intermediate Stage

Typically, an intermediate ashing stage is used to ash remnant resist remaining on the substrate 20 after the insulative oxide etch. Conventional ashing techniques can be used in this stage. A suitable ashing technique comprises flowing oxygen at a flow rate of about 80 sccm into the chamber 42, and maintaining the chamber at a pressure of about 10 mTorr. A plasma is generated from the oxygen by applying an RF current having a power level of about 2500 Watts to the inductive coil ,50. An RF bias current having a power level of from about 200 Watts is applied to the cathode 60 for causing the plasma to ash the resist layer 28 on the substrate 20.

Second Stage

The titanium nitride layer 24c is etched in this stage. A suitable etchant gas for etching the titanium nitride layer 24c comprises $CH_3F$ and $CO_2$, in a volumetric flow ratio of from about 1:6 to about 2:1, more preferably from about 1:1 to about 1:3, and most preferably about 1:2. This gas composition provides a sufficiently high titanium nitride etch rate that substantially all the titanium nitride 24c layer can be etched without etching all the oxide layer 26. For a twenty-two liter process chamber, suitable $CH_3F$ flow rates are from about 20 to about 80 sccm, and more typically about 40 sccm; and suitable $CO_2$ flow rates are from about 40 to about 120 sccm, and more typically about 80 sccm.

The chamber 42 is typically maintained at a pressure of about 10 to about 50 mTorr, and more typically about 20 mTorr. A plasma is generated from the etchant gas by applying an RF current having a power level of from about 1200 to about 2500 Watts, and more typically about 1800 Watts, to the inductive coil 50. The RF bias current applied to the cathode 60 has a power level of from about 50 to 500 Watts, and more typically about 200 Watts.

In both the single and multiple stage versions of the etching process, the quartz sidewall 52 of apparatus 50 is heated to a temperature of from about 200° C. to about 240° C., and more preferably about 215° C. to about 220° C., to prevent the deposition of condensable etchant byproduct species on the sidewall. The silicon slab 56 of the apparatus 50 is typically maintained at a temperature of from about 200° C. to about 250° C., and more typically about 215° C., to provide a sufficient amount of fluorine scavenging silicon species, to maintain the desired carbon to fluorine ratio in the process zone 44. Also, in both versions of the process, the plasma formed from the etchant gas heats the substrate 20 to a temperature of from about 5° C. to about 100° C. The temperature of the substrate 20 is maintained at a substantially constant level by passing helium within the grooves 66 of the chuck 64. Typically, the helium is flowed at pressure of from about 12 to about 16 mTorr, and more typically at a pressure of about 14 mTorr.

EXAMPLES

The following examples demonstrate the effectiveness of a process according to the present invention. In these examples, a "5300 HDP OXIDE ETCHER" apparatus, commercially available from Applied Materials, Santa Clara, Calif., was used.

The examples were carried out on eight-inch (200 ram) diameter silicon wafers. The wafer had thereon a barrier layer 24a, a conductive layer 24b comprising an aluminum alloy, and an antireflective layer 24c of titanium nitride approximately 250 Å thick. A 1.5 pm thick insulative oxide layer 26 of silicon oxide was deposited over the titanium nitride layer.

Examples 1 & 2

Table I lists the process conditions used for Examples 1 and 2. Both of these examples illustrate a single-stage process, in which an etchant gas comprising $C_2F_6$ and CO was used.

The etch rate was measured by examining a cross-section of the etched wafer in a scanning electron microscope using conventional techniques. The etch rate reflects the combined etch rate for both the titanium nitride and the insulative oxide layers. Example 2 provided the fastest etch rate and had no residual titanium nitride on the contact.

TABLE I

| | | | PROCESS CONDITIONS FOR EXAMPLES 1 AND 2 | | | | | |
|---|---|---|---|---|---|---|---|---|
| EXAMPLE NO. | $C_2F_6$ (sccm) | CO (sccm) | PRESSURE (mTorr) | COIL RF (Watts) | CATHODE RF (Watts) | SILICON SLAB (°C.) | QUARTZ SIDEWALL (°C.) | ETCH TIME (secs) | ETCH RATE (Å/min) |
| 1 | 25 | 100 | 4 | 2500 | 1500 | 215 | 215 | 45 | 7962 |
| 2 | 25 | 50 | 4 | 2500 | 1500 | 215 | 215 | 45 | 9527 |

Example 3

Example 3 provides a preferred version of the multiple stage process comprising a first stage in which the insulative oxide layer on the substrate was etched, an intermediate resist ashing stage, and a second stage for etching the titanium nitride layer.

Table II lists the process conditions used in each stage of Example 3. In this example, the etchant gas comprised $CH_3F$ and $CO_2$.

TABLE II

| | | | PROCESS CONDITIONS FOR EXAMPLE 3 | | | | | |
|---|---|---|---|---|---|---|---|---|
| PROCESS STAGE | $CH_3F$ (sccm) | $CO_2$ (sccm) | $O_2$ (sccm) | PRESSURE (mTorr) | COIL RF (Watts) | CATHODE RF (Watts) | SILICON SLAB (°C.) | QUARTZ SIDEWALL (°C.) | ETCH TIME (secs) |
| Oxide Etch | 25 | 0 | 0 | 4 | 2500 | 1500 | 215 | 215 | 100 |
| Ashing | 0 | 0 | 80 | 10 | 2500 | 200 | 215 | 215 | 40 |
| TiN Etch | 40 | 80 | 0 | 20 | 1800 | 200 | 215 | 215 | 45 |

Although the present invention has been described in considerable detail with regard to the preferred versions thereof, other versions are possible. For example, gases comprising carbon, fluorine and oxygen, such as $COF_2$ can also be used. Therefore, the appended claims should not be limited to the descriptions of the preferred versions contained herein.

What is claimed is:

1. A process for etching titanium nitride on a substrate, the process comprising the steps of:
   (a) placing a substrate having a titanium nitride layer thereon into a process zone;
   (b) introducing into the process zone an etchant gas comprising carbon-fluoride gas and carbon-oxide gas; and
   (c) forming a plasma from the etchant gas for etching the titanium nitride layer on the substrate.

2. The process of claim 1, wherein the carbon-fluoride gas comprises a gas selected from the group consisting of $CF_3$, $CF_4$, $CH_3F$, $CHF_3$, $C_2F_6$, $C_3F_8$, $C_4F_8$ and $C_4F_{10}$.

3. The process of claim 1, wherein the carbon-oxide gas comprises a gas selected from the group consisting of CO and $CO_2$.

4. The process of claim 1, wherein the substrate further comprises an insulative oxide layer over the titanium nitride layer, and wherein both the insulative oxide layer and the titanium nitride layer are etched by the plasma.

5. The process of claim 4, wherein the substrate has a resist layer overlying portions of the insulative oxide layer, and wherein the volumetric flow ratio of carbon-fluoride gas to carbon-oxide gas is selected so that the ratio of the combined oxide and titanium nitride etch rate to the resist etch rate, is at least about 3.

6. The process of claim 5, wherein the volumetric flow ratio of carbon-fluoride gas to carbon-oxide gas is selected so that the ratio of the combined oxide and titanium nitride etch rate to the resist etch rate, is at least about 4.

7. The process of claim 1, wherein the carbon-fluoride gas comprises $C_2F_6$ and the carbon-oxide gas comprises CO.

8. The process of claim 7, wherein the volumetric flow ratio of $C_2F_6$ to CO is from about 1:5 to about 1:40.

9. The process of claim 8, wherein the volumetric flow ratio of $C_2F_6$ to CO is from about 1:1 to about 1:3.

10. The process of claim 7, wherein the process zone is maintained at a pressure from about 1 mTorr to about 10 mTorr.

11. The process of claim 7, wherein an inductive coil encircles the process zone, and wherein the step of forming a plasma from the etchant gas comprises applying an RF current having a power level of from about 1000 to about 3000 Watts to the inductive coil.

12. The process of claim 11, wherein the substrate is placed on a cathode in the process zone, and wherein an RF current having a power level of from about 1000 to about 2000 Watts is applied to the cathode.

13. The process of claim 1, wherein the carbon-fluoride gas comprises $CH_3F$ and the carbon-oxide gas comprises $CO_2$.

14. The process of claim 13, wherein the volumetric flow ratio of $CH_3F$ to $CO_2$ is from about 1:6 to about 2:1.

15. The process of claim 14, wherein the volumetric flow ratio of $CH_3F$ to $CO_2$ is from about 1:1 to about 1:3.

16. The process of claim 13, wherein the process zone is maintained at a pressure of from about 10 mTorr to about 50 mTorr.

17. The process of claim 13, wherein an inductive coil encircles the process zone, and wherein the step of maintaining a plasma from the etchant gas comprises applying an RF current to the inductive coil at a power level of from about 1200 to about 2500 Watts.

18. The process of claim 17, wherein the substrate is placed on a cathode in the process zone, and wherein an RF current having a power level of from about 50 to about 500 Watts is applied to the cathode.

19. The process of claim 1, wherein the plasma formed from the etchant gas comprises different gaseous species, and wherein the process zone is in a process chamber having an interior wall comprising a material which scavenges a portion of the gaseous species in the plasma.

20. The process of claim 19, wherein the interior wall is heated to a temperature varying from about 200° C. to about 240° C.

21. A process for etching oxide and titanium nitride layers on a substrate, the process comprising the steps of:
 (a) placing a substrate into a process zone, the substrate having a titanium nitride layer thereon, and having an insulative oxide layer over the titanium nitride layer;
 (b) introducing into the process zone an etchant gas comprising $C_2F_6$ and CO; and
 (c) forming a plasma from the etchant gas for etching both the insulative oxide layer and the titanium nitride layer on the substrate.

22. The process of claim 21, wherein a resist layer overlays portions of the oxide layer, and wherein the volumetric flow ratio of $C_2F_6$ to CO is selected so that the ratio of the combined insulative oxide and titanium nitride etch rates to the resist etch rate is at least about 3.

23. The process of claim 22, wherein the volumetric flow ratio of $C_2F_6$ to CO is selected so that the ratio of the combined insulative oxide and titanium nitride etch rates to the resist etch rate is at least about 4.

24. The process of claim 21, wherein the volumetric flow ratio of $C_2F_6$ to CO is from about 1:5 to about 1:40.

25. The process of claim 21, wherein the process zone is maintained at a pressure from about 1 mTorr to about 10 mTorr.

26. The process of claim 21, wherein an inductive coil encircles the process zone, and wherein the substrate is placed on a cathode in the process zone, and wherein the step of forming a plasma from the etchant gas comprises applying an RF current having a power level from about 1000 to about 3000 Watts to the inductive coil, and applying an RF current having a power level of from about 1000 to about 2000 Watts to the cathode.

27. A process for etching oxide and titanium nitride layers on a substrate, the process comprising the steps of:
 (a) placing a substrate into a process zone, the substrate having a titanium nitride layer thereon, and having an insulative oxide layer over the titanium nitride layer;
 (b) introducing a carbon-fluoride gas into the process zone, forming a plasma from the carbon-fluoride gas for etching the insulative oxide layer on the substrate, and exhausting the gaseous etchant by-products formed during etching; and
 (c) introducing an etchant gas comprising $CH_3F$ and $CO_2$ into the process zone, and forming a plasma from the etchant gas for etching the titanium nitride layer on the substrate.

28. The process of claim 27, wherein the volumetric flow ratio of $CH_3F$ to $CO_2$ is selected so that the titanium nitride is etched at a rate of at least about 1 micron/minute.

29. The process of claim 27, wherein the volumetric flow ratio of $CH_3F$ to $CO_2$ is from about 1:6 to about 2:1.

30. The process of claim 27, wherein an inductive coil encircles the process zone, and wherein the substrate is placed on a cathode in the process zone, and wherein the step of forming a plasma from the etchant gas comprises applying an RF current to the inductive coil at a power level of from about 50 to about 500 Watts, and applying an RF current having a power level of from about 100 to about 300 Watts to the cathode.

31. The process of claim 27, wherein the process zone is maintained at a pressure of from about 10 mTorr to about 50 mTorr.

32. The process of claim 27, wherein the substrate has remnant resist thereon, and wherein after step (b), the remnant resist on the substrate is ashed using a plasma generated from an oxygen-containing gas.

* * * * *